US012130327B2

(12) United States Patent
Imaizumi et al.

(10) Patent No.: US 12,130,327 B2
(45) Date of Patent: Oct. 29, 2024

(54) ELECTRONIC COMPONENT TESTING APPARATUS, SOCKET, AND CARRIER

(71) Applicant: ADVANTEST Corporation, Tokyo (JP)

(72) Inventors: Naoto Imaizumi, Tokyo (JP); Sungywen Kim, Tokyo (JP); Masanori Nagashima, Tokyo (JP); Takashi Kawashima, Tokyo (JP); Akihiko Ito, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 0 days.

(21) Appl. No.: 17/898,860

(22) Filed: Aug. 30, 2022

(65) Prior Publication Data

US 2023/0105734 A1 Apr. 6, 2023

(30) Foreign Application Priority Data

Oct. 5, 2021 (JP) ................................ 2021-164099

(51) Int. Cl.
*G01R 31/28* (2006.01)

(52) U.S. Cl.
CPC ................................ *G01R 31/2887* (2013.01)

(58) Field of Classification Search
CPC ........ G01R 31/00; G01R 31/02; G01R 31/20; G01R 31/28; G01R 1/02; G01R 1/04; G01R 1/067; G01R 1/073; G01R 1/44; G01N 27/04; H01L 21/66; H01L 21/4763; H01L 23/538; H01L 23/58
See application file for complete search history.

(56) References Cited

U.S. PATENT DOCUMENTS 6,573,739 B1 6/2003 Saito
2021/0003631 A1* 1/2021 Kim .................. G01R 31/2893
2021/0302467 A1 9/2021 Lei et al.

FOREIGN PATENT DOCUMENTS

JP H11287841 * 10/1999 ......... G01R 31/2886
JP 2018189392 * 11/2018 ........... G01R 1/0408
JP 2018189392 A 11/2018
KR 10-1999-0082838 A 11/1999
(Continued)

OTHER PUBLICATIONS

Office Action issued in counterpart Taiwanese Application No. 111130387, dated May 8, 2023 (11 pages).
(Continued)

*Primary Examiner* — Neel D Shah
(74) *Attorney, Agent, or Firm* — Osha Bergman Watanabe & Burton LLP

(57) ABSTRACT

An electronic component testing apparatus that tests a DUT (device under test) disposed in a carrier includes: a test head including a socket; and an electronic component handling apparatus that presses the DUT in the carrier against the socket. The socket includes: contactors disposed to correspond to terminals of the DUT that are exposed to the socket via a first opening of the carrier; and a first wall projecting toward the carrier along a pressing direction of the DUT. The electronic component handling apparatus aligns the terminals with the contactors by pressing the DUT against the socket such that a first pressing mechanism of the carrier presses the DUT against the first wall.

10 Claims, 16 Drawing Sheets

(56) References Cited

FOREIGN PATENT DOCUMENTS

| | | | |
|---|---|---|---|
| KR | 10-2010-0061570 | A | 6/2010 |
| KR | 10-2018-0121361 | A | 11/2018 |
| TW | 200740037 | A | 10/2007 |
| TW | 201632889 | A | 9/2016 |
| TW | 201842342 | A | 12/2018 |
| TW | 201842345 | A | 12/2018 |

OTHER PUBLICATIONS

Office Action issued in counterpart Taiwanese Application No. 111130387, dated Nov. 17, 2023 (7 pages).
Office Action issued in coressponding Korean Application No. 10-2022-0104548, dated Jan. 5, 2024 (15 pages).
Office Action issued in counterpart Taiwanese Application No. 11320513460, dated May 22, 2024 (4 pages).

* cited by examiner

Z
Y
X

ELECTRONIC COMPONENT TESTING APPARATUS, SOCKET, AND CARRIER

BACKGROUND

Technical Field

The present invention relates to an electronic component testing apparatus used to test an electronic component under test (hereinafter, simply referred to as a "DUT" (Device Under Test)) such as a semiconductor integrated circuit device, and to sockets and carriers used in the electronic component testing apparatus.

Description of Related Art

An electronic component testing apparatus is known, which accommodates the DUT in the device carrier having a pressing mechanism, aligns external terminals of the DUT and contactors of the IC socket, and tests the DUT (e.g., see Patent Document 1).

PATENT DOCUMENT

Patent Document 1: JP 2018-189392 A

In the electronic component testing apparatus described above, the dimensional tolerance of the device carrier and the fitting tolerance between the guide hole of the device carrier and the guide pin of the IC socket affects the alignment accuracy between the external terminals of the DUT and the contactors of the IC socket. Therefore, when testing the DUT that has external terminals arranged at a very narrow pitch, though high-precision alignment is required, it may fail to ensure sufficient alignment accuracy.

SUMMARY

One or more embodiments of the present invention provide an electronic component testing apparatus capable of aligning a terminal of the DUT and a contactor of a socket with high accuracy, and a socket and a carrier used in the electronic component testing apparatus.

[1] The electronic component testing apparatus according to one or more embodiments of the present invention is an electronic component testing apparatus that test a device under test (DUT), comprising: a test head having a socket; and an electronic component handling apparatus that presses the DUT accommodated in a carrier against the socket, wherein the socket includes a plurality of contactors provided corresponding to terminals of the DUT; and a first wall projecting toward the carrier along a pressing direction of the DUT, the carrier includes a first pressing mechanism that presses the DUT disposed on the socket against the first wall of the socket; and a first opening that exposes the terminals of the DUT to the socket, and when the electronic component handling apparatus presses the DUT against the socket, the first pressing mechanism presses the DUT against the first wall to align the terminals of the DUT to the contactors of the socket.

[2] In one or more embodiments, the carrier further may include a second opening through which the first wall can enter, and the first wall may enter the interior of the carrier through the second opening when the electronic component handling apparatus presses the DUT into the socket.

[3] In one or more embodiments, the second opening may be integrally formed with the first opening.

[4] In one or more embodiments, the socket may include one of a guide pin and a guide hole, the carrier may include the other of the guide hole and the guide pin corresponding to one of the guide pin and the guide hole, and when the electronic component handling apparatus presses the DUT to the socket, inserting the guide into the guide hole aligns the carrier and the socket.

[5] In one or more embodiments, the first wall may include a tapered shape inclined so that the width of the first wall becomes larger along the pressing direction from the tip of the first wall.

[6] In one or more embodiments, the socket may include a second wall that extends in a direction different from the first wall; and the carrier may include a second pushing mechanism that presses the DUT disposed on the socket toward the second wall and a third opening through which the second wall can enter, and the second wall may enter the interior of the carrier through the third opening when the electronic component handling apparatus presses the DUT against the socket.

[7] In one or more embodiments, the socket may include a holder that holds the contactors; and a moving member movably supported on the holder along the pressing direction, and the first wall may be provided on the moving member.

[8] In one or more embodiments, the first pressing mechanism may press the DUT against the first wall by the guide pin inserted into the guide hole contacting the first pressing mechanism.

[9] The socket according to one or more embodiments of the present invention is a socket used in an electronic component testing apparatus that tests a DUT, comprising: a plurality of contactors provided corresponding to the terminals of the DUT, a holder that holds the contactors, and a first wall protruding along the pressing direction of the DUT.

[10] In one or more embodiments, the socket may include a second wall that extends in a direction different from the first wall.

[11] The carrier according to one or more embodiments of the present invention is a carrier used in the electronic component testing apparatus of one or more embodiments, the carrier has the second opening.

In the electronic component testing apparatus according to one or more embodiments of the present invention, the socket includes a first wall projecting toward the carrier, the carrier includes a first pressing mechanism that presses the DUT to the first wall. Thus, when the electronic component handling apparatus of the electronic component testing apparatus presses the DUT to the socket, the first pressing mechanism presses the DUT against the first wall to align the terminals of the DUT and the contactors of the socket. This allows to align the terminals of the DUT and the contactors of the socket with high accuracy without affected by the dimensional tolerance of the carrier and the fitting tolerance between the guide hole of the carrier and the guide pin of the socket.

DETAILED DESCRIPTION

Hereinafter, embodiments of the present invention will be described with reference to the drawings.

Figure 1:
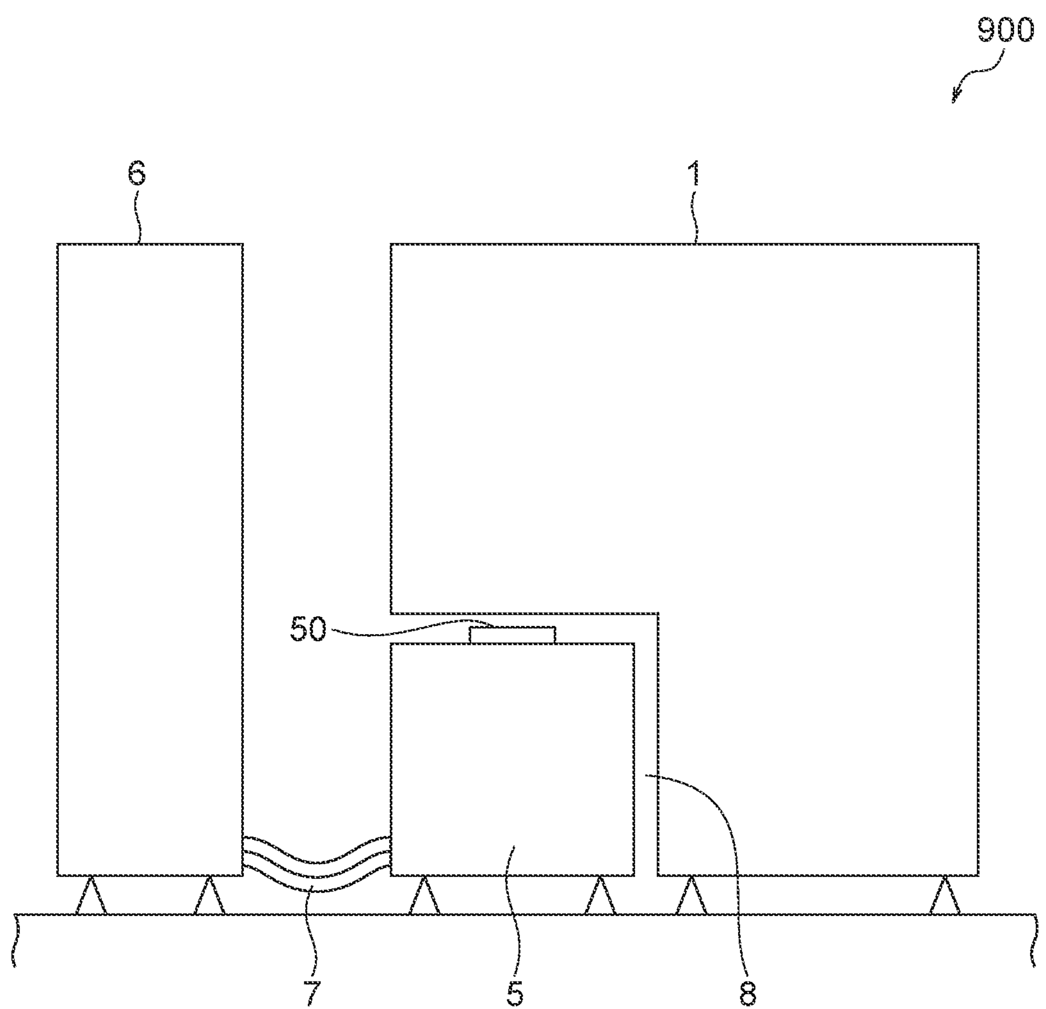
FIG. 1 is a schematic cross-sectional view of the overall configuration of the electronic component testing apparatus according to one or more embodiments of the present invention.
Figure 2:
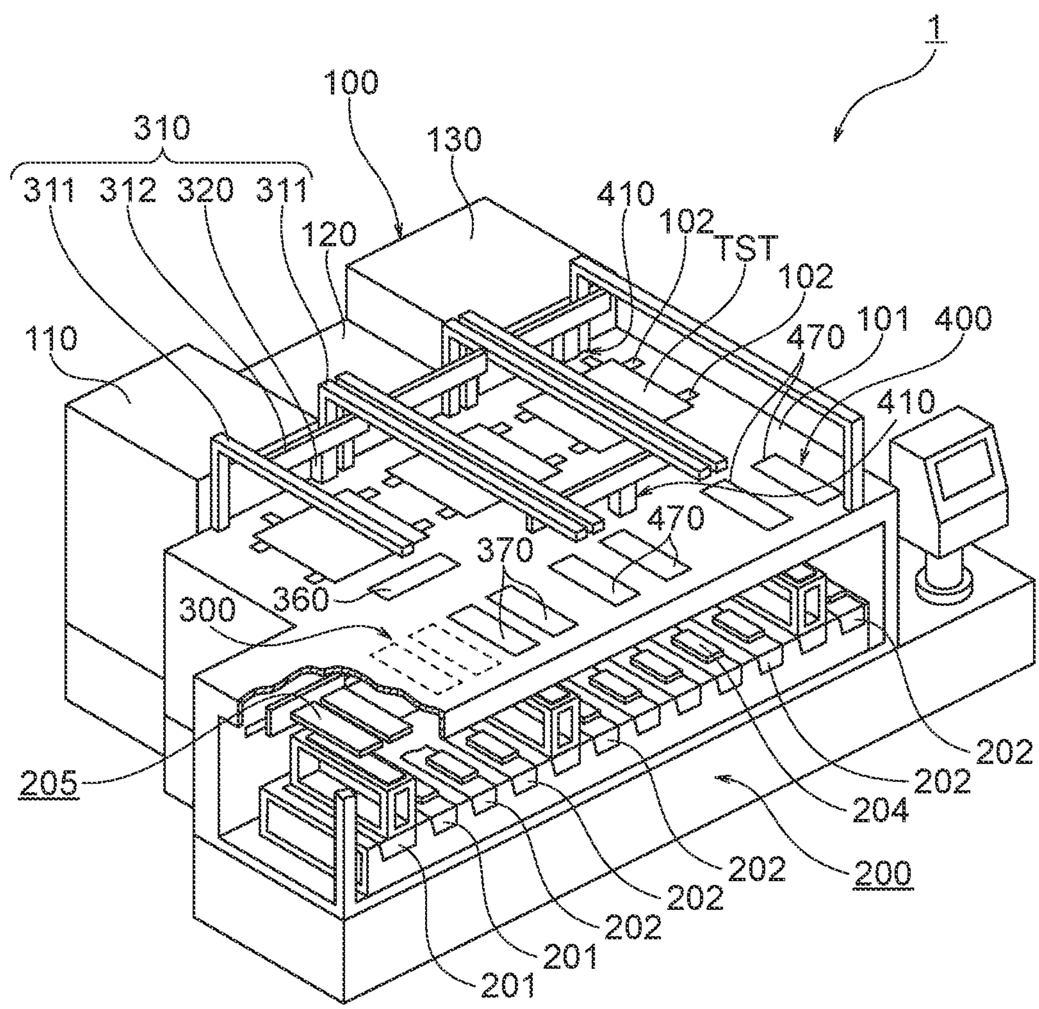
FIG. 2 is a perspective view of an electronic component testing apparatus of FIG. 1.
Figure 3:
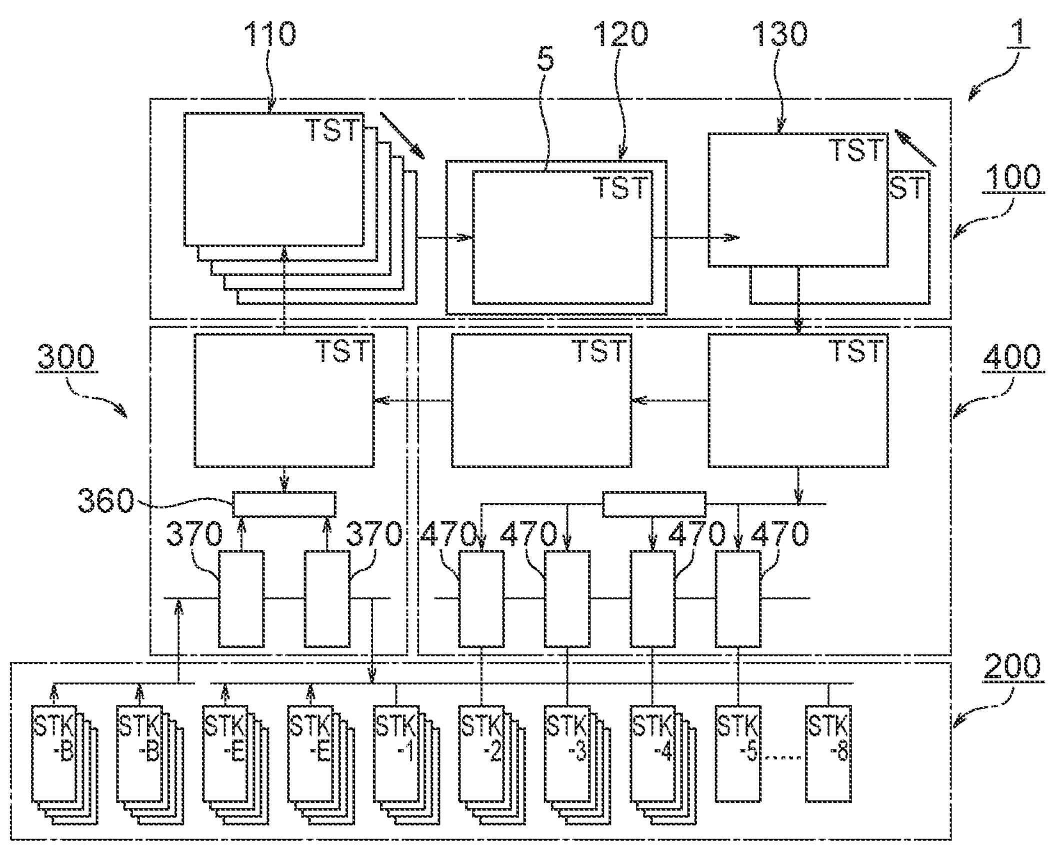
FIG. 3 is a conceptual diagram for explaining the transfer of the tray in the electronic component testing apparatus of FIGS. 1 and 2.

FIG. 1 is a schematic cross-sectional view of the overall configuration of the electronic component testing apparatus according to one or more embodiments of the present invention, FIG. 2 is a perspective view of an electronic component testing apparatus of FIG. 1, and FIG. 3 is a conceptual diagram for explaining the transfer of the tray in the electronic component testing apparatus of FIGS. 1 and 2.

The electronic component testing apparatus 900 shown in FIGS. 1 and 2 includes a handler 1, a test head 5, and a tester 6. The electronic component testing apparatus 900 applies a high-temperature stress or a low-temperature stress to the DUT 90 (see FIG. 12) to test (inspect) whether the DUT 90 operates properly in this condition using the test head 5 and the tester 6. Then, the electronic component testing apparatus 900 classifies the DUT 90 based on the test results. Although not particularly limited, the DUT 90 of one or more embodiments is, for example, a semiconductor chip packaged with a molding material such as a resin material or the like. As a specific example of such a DUT 90, a memory-based device can be exemplified, but a logic-based device, a SoC (System on a chip), or the like may be used.

The handler 1 in one or more embodiments corresponds to an example of the "electronic component handling apparatus" in the present invention, and the test head 5 in one or more embodiments corresponds to an example of the "test head" in the present invention.

Figure 5:
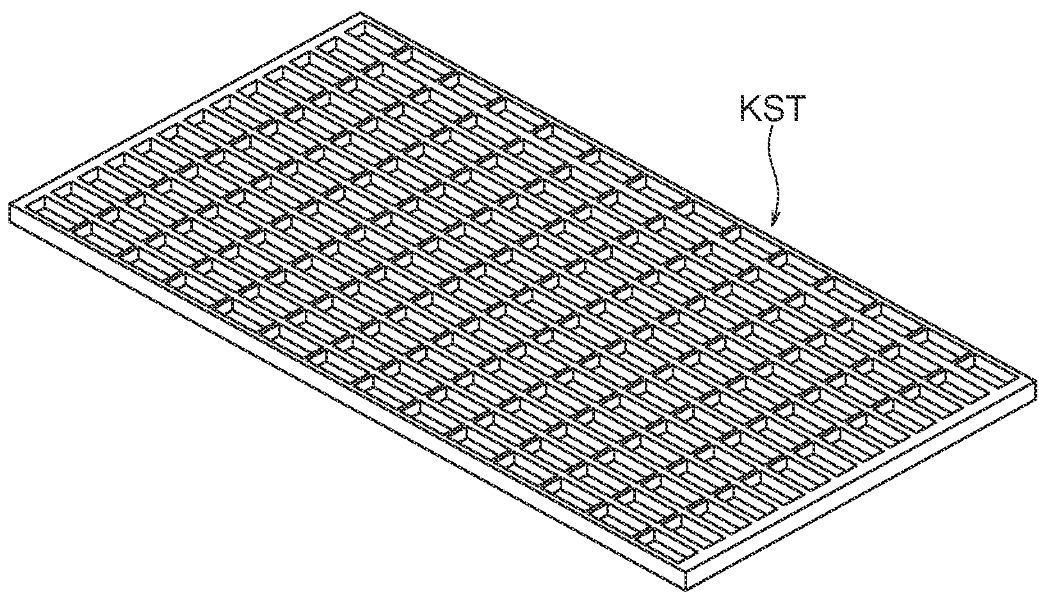
FIG. 5 is a perspective view of a customer tray used in the electronic component testing apparatus described above.

In the electronic component testing apparatus 900, a large number of the DUT 90 to be tested are mounted on a customer tray KST (see FIG. 5). In the handler 1 of the electronic component testing apparatus 900, the test tray TST (see FIG. 6) is circulated. The DUT 90 is tested by replacing the customer tray KST with the test tray TST.

In the electronic component testing apparatus 900, the DUT 90 mounted on the test tray TST, and a socket 50 on the test head 5 is electrically connected in contact, the DUT 90 is tested (inspected) based on a signal outputted from the tester 6 to the test head 5 via the cable 7. When changing the DUT 90 type, the sockets 50 and the cores 730, which will be described later, are changed so as to conform to the shapes of the DUT 90, the number of pins, and the like.

As shown in FIGS. 2 and 3, the handler 1 includes a storage unit 200, a loader unit 300, a test unit 100, and an unloader unit 400. The storage unit 200 stores pre-test and pre-test the DUT 90. The loader unit 300 transfers the DUT 90 transferred from the storage unit 200 to the test unit 100. The test unit 100 is configured such that the socket 50 of the test head 5 faces the inside. The unloader unit 400 classifies the tested the DUT 90 tested by the test unit 100.

Figure 4:
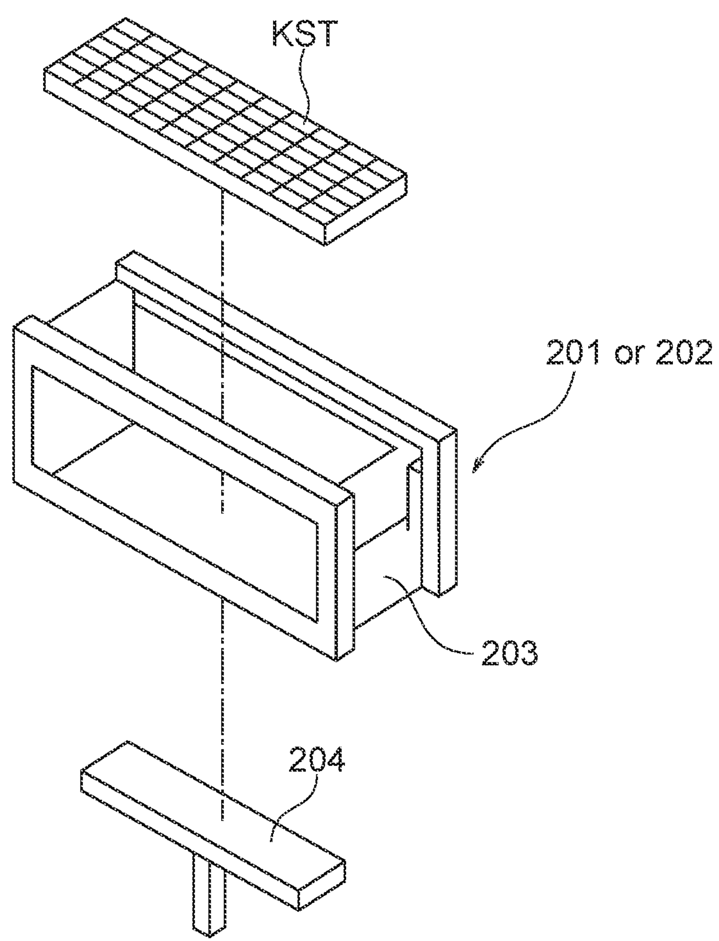
FIG. 4 is an exploded perspective view of an IC stocker used in the electronic component testing apparatus described above.

FIG. 4 is an exploded perspective view of an IC stocker used in the electronic component testing apparatus, and FIG. 5 is a perspective view of a customer tray used in the electronic component testing apparatus.

As shown in FIG. 4, the storage unit 200 includes a pre-test stocker 201 and a tested stocker 202. The pre-test stocker 201 stores a customer tray KST in which the pre-test the DUT 90 is stored. The tested stocker 202 stores the customer tray KST containing the DUT 90 classified according to test results. The pre-test stocker 201 and the tested stocker 202 include a frame-shaped tray support frame 203, and an elevator 204 that enters from a lower portion of the tray support frame 203 and moves up and down toward the upper portion. A plurality of customer trays KST are stacked on the tray support frame 203. The stacked customer trays KST are moved up and down by the elevator 204.

As shown in FIG. 5, the customer tray KST includes a plurality of concave accommodating portions for accommodating DUT90 in the customer tray KST. The plurality of accommodation portions is arranged in a plurality of rows and a plurality of columns, for example, 14 rows and 13 columns. The pre-test stocker 201 and the tested stocker 202 have the same structure.

As shown in FIGS. 2 and 3, the pre-test stocker 201 is provided with two stockers STK-B and two empty tray stockers STK-E. The two stockers STK-B are adjacent to each other, and adjacent to these two stockers STK-B, two empty tray stockers STK-E are adjacent to each other. In the empty tray stocker STK-E, empty customer trays KST transferred to the unloader unit 400 are stacked.

A tested stocker 202 is provided next to the pre-test stocker 201. Eight stockers STK-1, STK-2, . . . , STK-8 are provided in the tested stocker 202. The tested stocker 202 is configured to store tested DUT90 in up to eight categories depending on the test results. For example, the tested DUT 90 can be classified as good and defective. In addition, tested DUT 90 can be classified as a high-speed operation good, a medium-speed operation good, and a low-speed operation good. Or tested DUT 90 can be classified as defective requiring retest and defective unnecessary retest.

The storage unit 200 further includes a tray transfer arm 205, as shown in FIG. 2. The tray transfer arm 205 is provided between the pre-test stocker 201 and the apparatus base 101. The tray transfer arm 205 transfers the customer tray KST from the lower side of the apparatus base 101 to the loader unit 300. The apparatus base 101 has a pair of window portions 370 formed at a position corresponding to the loader unit 300.

The loader unit 300 includes a device transport apparatus 310. The device transport apparatus 310 includes two rails 311, a movable arm 312, and a movable head 320. The two rails 311 are mounted on the apparatus base 101. The movable arm 312 reciprocates between the test tray TST and the customer tray KST along the two rails 311. The movable head 320 is supported by the movable arm 312 moves in the X-axis direction. A plurality of suction pads (not shown) is mounted downward on the movable head 320.

The device transport apparatus 310 moves the movable head 320 having a plurality of DUT90 adsorbed by the plurality of adsorption pads from the customer tray KST to preciser 360. Thereby, the DUT 90 is transferred from the customer tray KST to the preciser 360. The device transport apparatus 310 then modifies the inter-positional relation of DUT90 at the preciser 360 by the movable arm 312 and the movable head 320. Thereafter, the device transport apparatus 310 transports the DUT 90 to the test tray TST stopped by the loader unit 300. The DUT 90 is then transferred from the customer tray KST to the test tray TST.

The test unit 100, as shown in FIGS. 2 and 3, includes a soak chamber 110, a test chamber 120, and an unsoak chamber 130. The soak chamber 110 applies a desired high or low temperature stress to the DUT 90 mounted on the test tray TST. The test chamber 120 presses the DUT 90 that has been stressed in soak chamber 110 against the test head 5. The unsoak chamber 130 removes thermal stress from the DUT 90 tested in the test chamber 120.

When a high temperature is applied to the DUT 90 in the soak chamber 110, the DUT 90 is cooled to room temperature in the unsoak chamber 130 by blowing air. On the other hand, when applying a low temperature to the DUT 90 in the soak chamber 110 is heated to a temperature such that condensation does not occur by hot air or heaters or the like the DUT 90 in the unsoak chamber 130.

As shown in FIG. 2, the soak chamber 110 and the unsoak chamber 130 protrudes above the test chamber 120. Further, as conceptually shown in FIG. 3, the soak chamber 110, a vertical transport apparatus (not shown) is provided. While the prior test tray TST is present in the test chamber 120, a plurality of test trays TST of the subsequent row waits in a state of being supported by the vertical transport apparatus. The DUT 90 mounted on the subsequent test trays TST is subjected to high or low temperature thermal stress during standby.

The test head 5 is disposed in the center of the test chamber 120. The test tray TST is transported over the test head 5. In the test chamber 120, Z-axis driving device for moving in the Z-axis direction (not shown) is provided. The test tray TST transported over the test head 5 is pressed against the test head 5 by lowering the Z-axis drive. As a result, the DUT 90 mounted on the test tray TST is pressed by the socket 50 on the test head 5, and the terminals 91 of the DUT 90 (see FIG. 12) contacts the contactors 53 (see FIG. 12) of the socket 50. The DUT 90 is tested in this condition. The test tray TST loaded with the DUT 90 for which the test has been completed is transported to the unsoak chamber 130. In the unsoak chamber 130, the DUT 90, which has been tested, is heat-removed to room temperature. The test tray TST on which the heat-removed the DUT 90 is mounted is carried out to the unloader unit 400.

The upper portion of the soak chamber 110, an inlet for carrying the test tray TST from the apparatus base 101 to the soak chamber 110 is formed. On the other hand, the upper portion of the unsoak chamber 130, an outlet for carrying out the test tray TST from the unsoak chamber 130 to the apparatus base 101 is formed.

As shown in FIG. 2, the unloader unit 400, two device transport apparatuses 410 is provided. The device transport apparatuses 410 has the same structure as the device transport apparatus 310 provided in the loader unit 300. The two device transport apparatuses 410 transport the tested DUT 90 from the test tray TST existing on the apparatus base 101 to the customer tray KST corresponding to the test result.

Two pairs of windows 470 are formed in the apparatus base 101. The two pairs of windows 470 are arranged so that the customer tray KST transported to the unloader unit 400 faces the upper surface of the apparatus base 101. The lower side of the two windows 470 and the window portion 370 described above, the lifting table (not shown) is provided. This lifting table lowers the customer tray KST on which the tested the DUT 90 is mounted and transfers the customer tray KST to the tray transfer arm 205.

Figure 6:
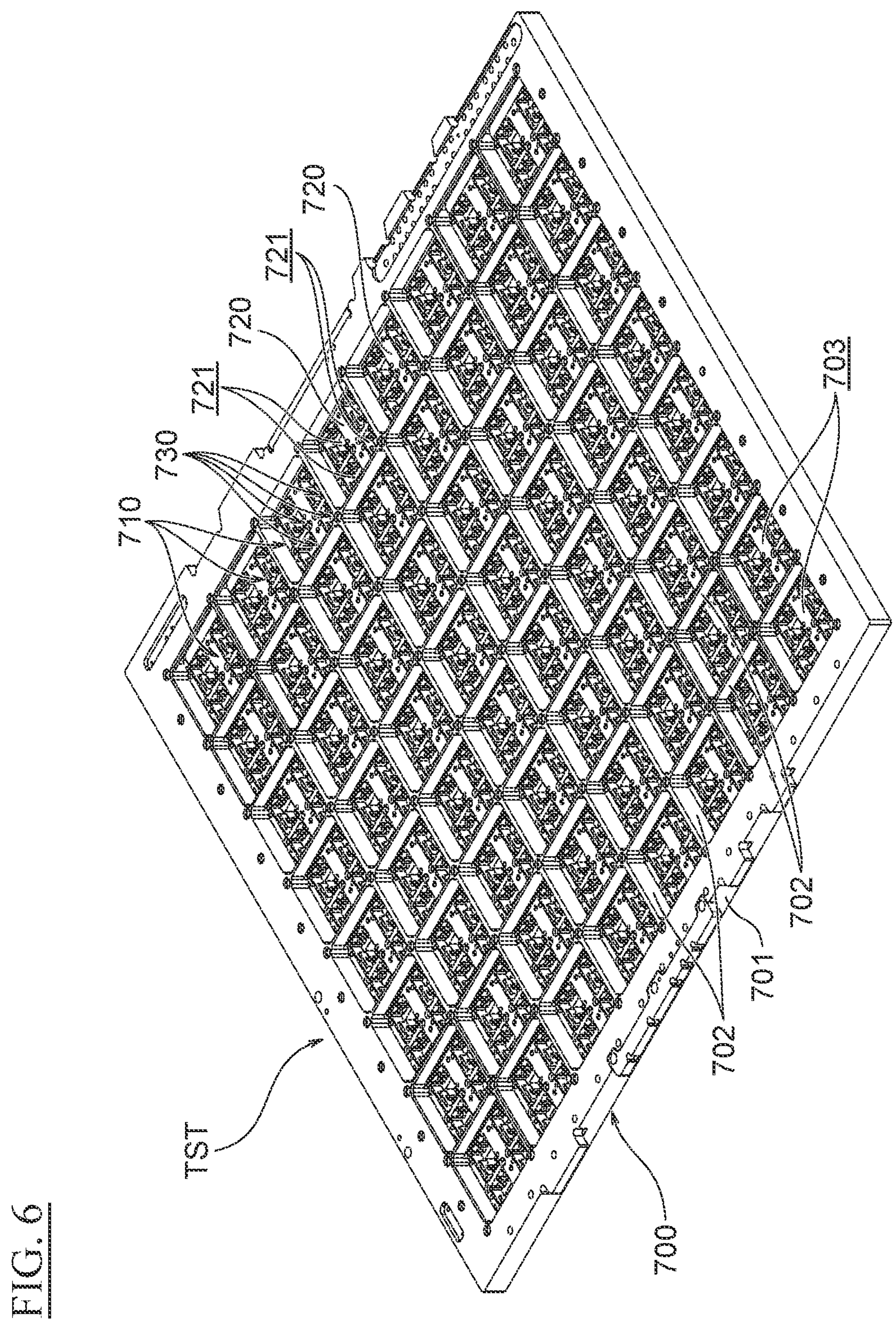
FIG. 6 is a perspective view of a test tray of one or more embodiments of the present invention.
Figure 7:
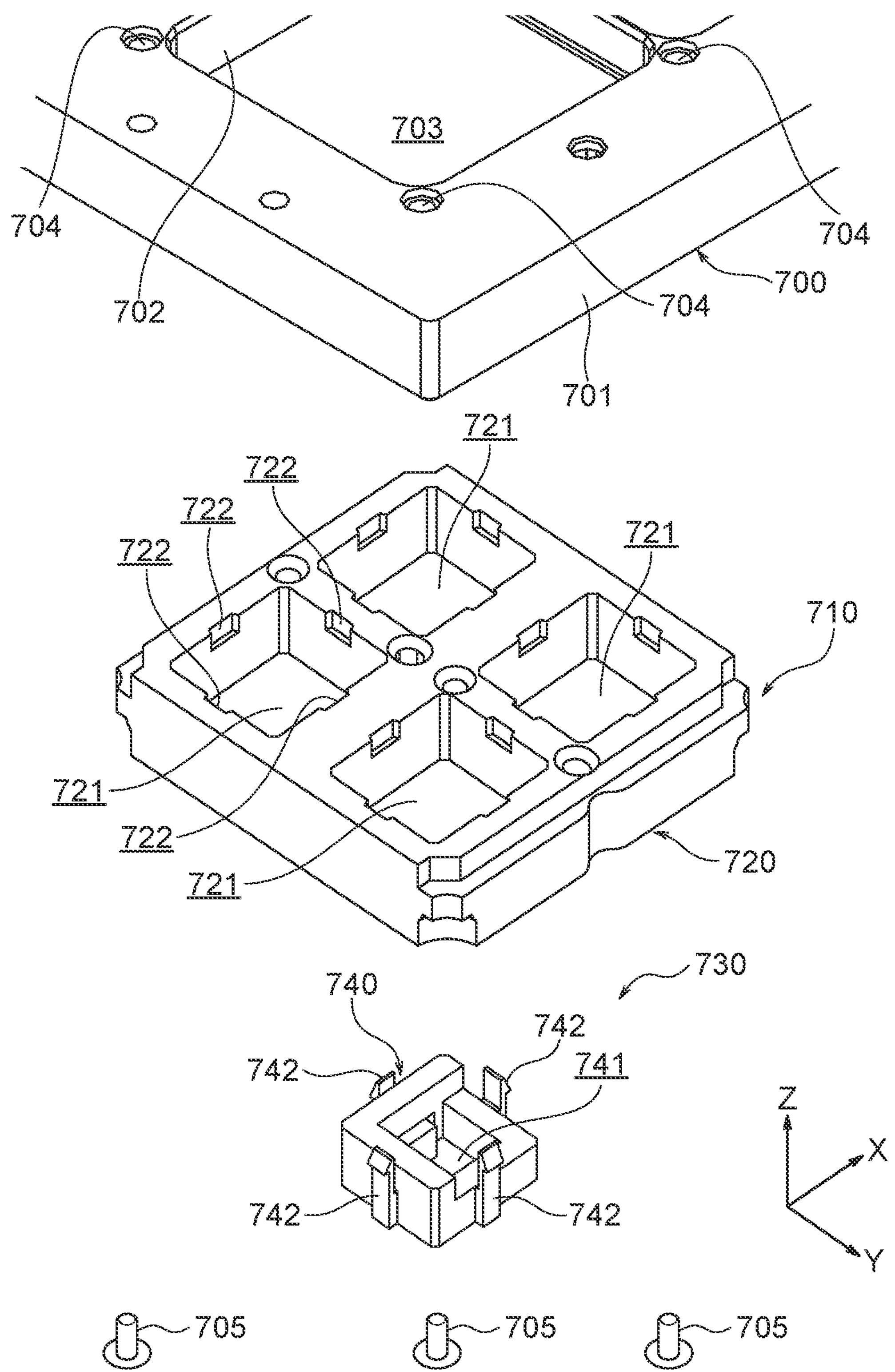
FIG. 7 is an exploded perspective view of an insert in one or more embodiments of the present invention.
Figure 8:
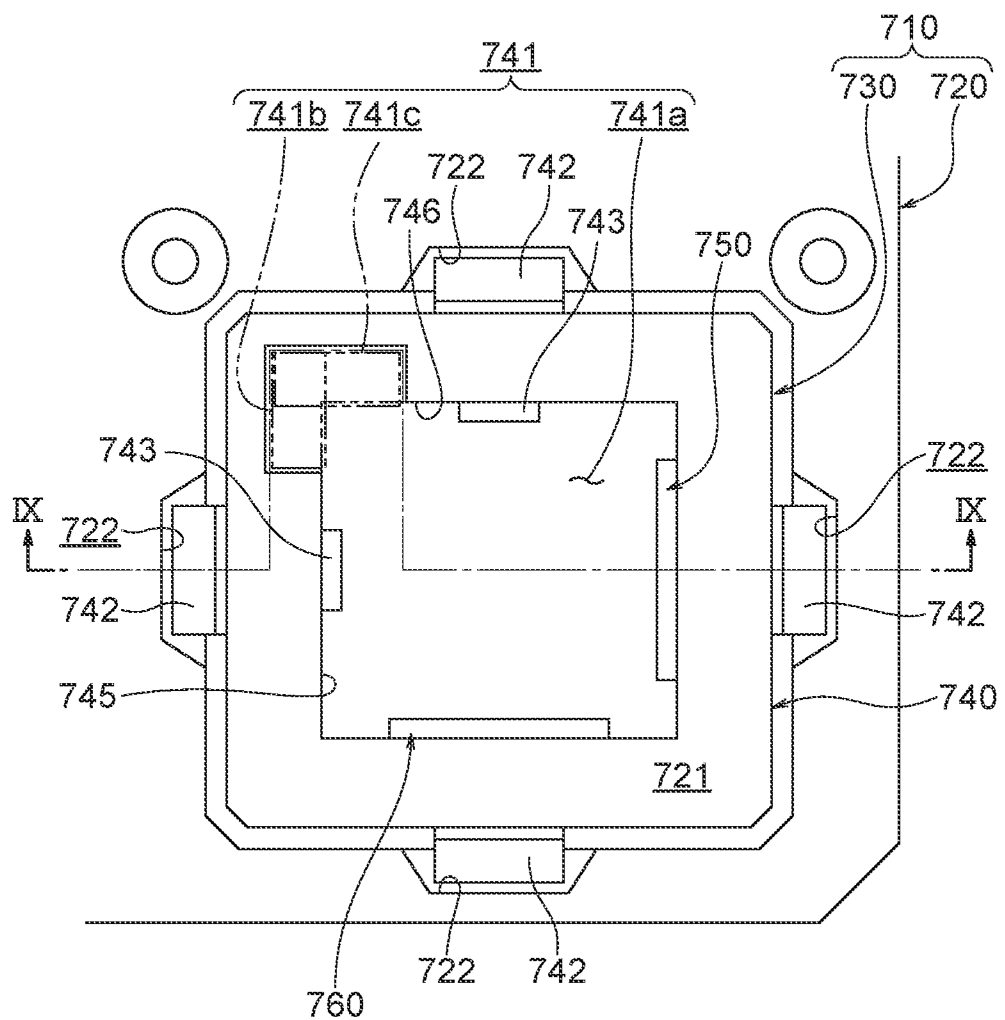
FIG. 8 is a plane view of the insert from above in one or more embodiments of the present invention.
Figure 9:
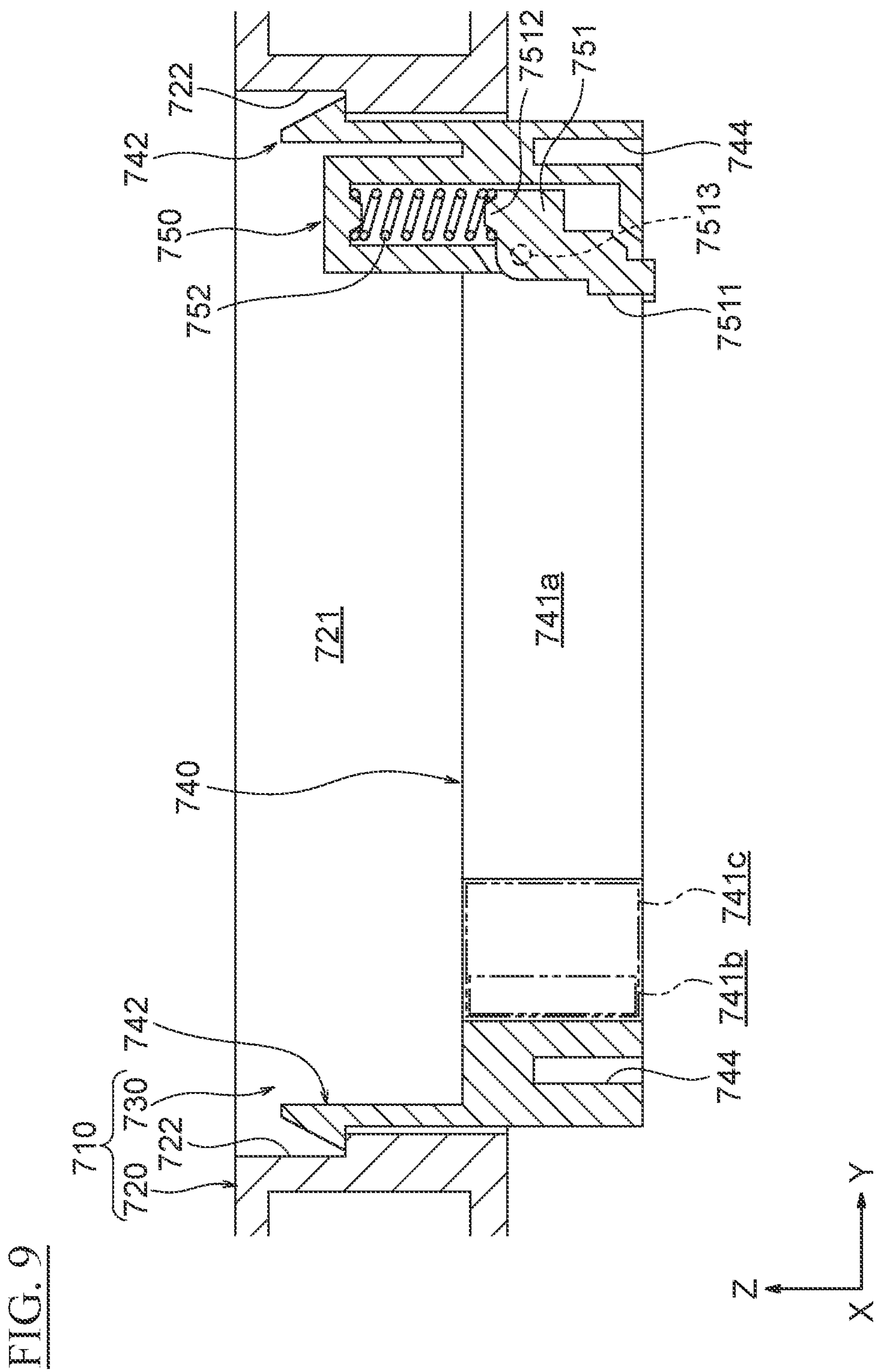
FIG. 9 is a cross-sectional view of the insert according to one or more embodiments of the present invention, taken along IX-IX line of FIG. 8.

FIG. 6 is a perspective view of a test tray TST, FIG. 7 is an exploded perspective view of an insert in one or more embodiments, FIG. 8 is a plane view of the insert in one or more embodiments from above, and FIG. 9 is a cross-sectional view of an insert in one or more embodiments is a view taken along IX-IX of FIG. 8.

As shown in FIG. 6, the test tray TST includes a frame 700 and a plurality of inserts 710. The frame 700 includes a rectangular outer frame 701, and an inner frame 702 of the lattice shape provided in the outer frame 701. The frame 700 is formed with a plurality of rectangular openings 703 partitioned by an outer frame 701 and an inner frame 702. In the frame 700, a plurality of through holes 704 are formed at intersections of the outer frame 701 and the inner frame 702 and at intersections of the inner frame 702. As shown in FIG. 7, a fixing member 705 is inserted into the through hole 704. The insert 710 in one or more embodiments corresponds to an example of a "carrier" in the present invention.

The inserts 710 are members that accommodates and holds the DUT 90 when the DUT 90 is transported by the test tray TST. Each insert 710 is provided corresponding to one opening 703. In other words, the plurality of inserts 710 are arranged to form a matrix of rows and columns within the frame 700 of the test tray TST.

As shown in FIG. 7, the insert 710 includes a body 720 and a plurality of cores 730.

The body 720 is a member that holds the insert 710 with respect to the frame 700 so as to be capable of fine movement. Of the plurality of bodies 720, the body 720 corresponding to the opening 703 located on the outermost periphery of the frame 700, a portion of the outer peripheral portion 720*a* of the body 720 overlaps the outer frame 701, the other portion of the outer peripheral portion 720*a* is disposed so as to overlap the inner frame 702. The other body 720 is disposed such that the outer peripheral portion 720*a* overlaps with the inner frame 702. Part of the outer peripheral portion 720*a* of the body 720 is sandwiched between the outer frame 701 or the inner frame 702 and the fixing member 705, whereby the body 720 is held in a state of being capable of fine movement in the XY plane direction with respect to the frame 700.

The body 720 is a member that holds the core 730. The body 720 is a rectangular frame-shaped resin molded body has a shape corresponding to the opening 703 of the frame 700. The body 720 has the same number of cores 730 (four in this example) rectangular openings 721. The plurality of openings 721 form a matrix of a plurality of rows and a plurality of columns in the body 720, which matrix is two rows and two columns in this example. The DUT 90 can be inserted through each opening 721. In one or more embodiments, four openings 721 are formed in the body 720, but the number of openings 721 is not particularly limited thereto.

Each opening 721 is formed so as to penetrate the body 720 in the Z-axis direction in FIG. The opening 721 communicates with the opening 741 (described later) of the core 730 when the core 730 is mounted on the body 720.

The body 720, as shown in FIG. 7, has the engaging portion 722. The claw 742 of the core 730 engages with the engaging portion 722. This causes the core 730 supported by the body 720.

The core 730, as shown in FIG. 8, is frame-shaped resin molded body, and has a core body 740, and two pressing mechanisms 750,760. The pressing mechanism 750 in one or more embodiments corresponds to an example of the "first pressing mechanism" in the present invention, and the pressing mechanism 760 in one or more embodiments corresponds to an example of the "second pressing mechanism" in the present invention.

The cores 730 are detachable from the body 720 and can be replaced according to the type of the DUT 90. The size of the shape and the opening 741 of the core body 740 can be appropriately designed according to the shape of the DUT 90.

The core body 740 has the opening 741. The opening 741 includes a DUT insertion portion 741*a* and socket insertion portions 741*b* and 741*c*. The DUT insertion portion 741*a* in one or more embodiments corresponds to an example of the "first opening" in the present invention, the socket insertion portion 741*b* in one or more embodiments corresponds to an example of the "second opening" in the present invention, and the socket insertion portion 741*c* in one or more embodiments corresponds to an example of the "third opening".

The DUT insertion portion 741*a* of the opening 741 has a rectangular shape corresponding to the outer shape of the DUT 90. As shown in FIG. 9, the DUT insertion portion 741*a* penetrates the core body 740 in the Z-axis direction in the drawing. The DUT insertion portion 741*a* communicates with the opening 721 of the body 720 when the core 730 is mounted on the body 720. This allows the DUT 90 inserted into the insert 710 through the opening 721 from above the body 720 to be inserted into the core body 740 through the DUT inserting portion 741*a* of the opening 741, then to be held in the core 730. The terminals 91 of the DUT 90 (to be described later) held by the cores 730 are exposed to the socket 50 through the DUT inserting portion 741*a* of the opening 741, and the terminals 91 can face the contactors 53 of the socket 50 during the DUT test (see FIG. 12).

Returning to FIG. 8, the socket insertion portion 741*b* of the opening 741 has a rectangular shape corresponding to the shape of the wall 55 of the socket 50 (described later). The socket insertion portion 741*c* of the opening 741 has a rectangular shape corresponding to the shape of the wall 56 of the socket 50. When the DUT 90 is tested, the DUT 90 is pressed against the socket 50. This allows the wall 55 of the socket 50 to enter the interior of the insert 710 via the socket insertion portion 741*b* and allows the wall 56 of the socket 50 to enter the interior of the insert 710 via the socket insertion portion 741*c*.

Figure 11:
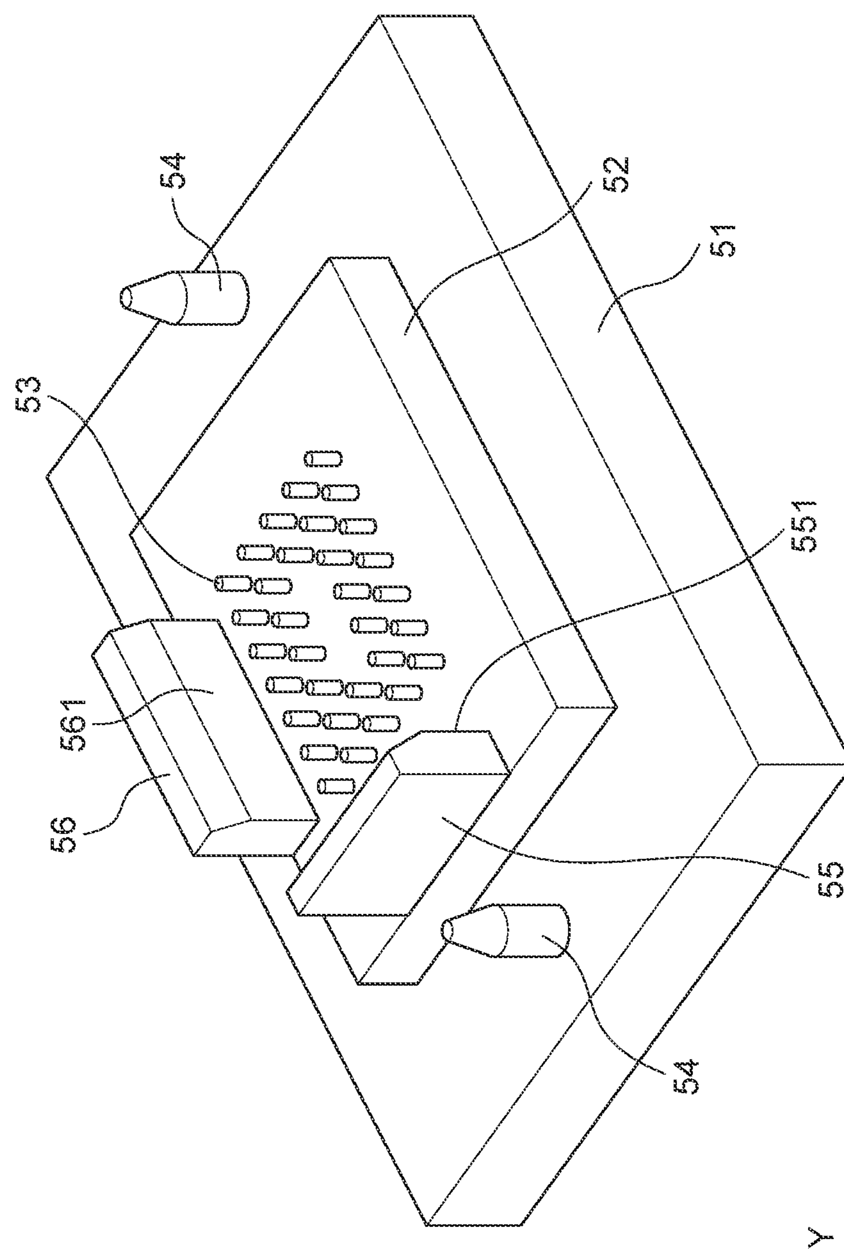
FIG. 11 is a perspective view of a first modification of the socket in one or more embodiments of the present invention.

In one or more embodiments, the socket insertion portions 741*b* and 741*c* partially overlap each other and are arranged in an L-shape, but the configuration of the socket insertion portions 741*b* and 741*c* is not particularly limited thereto. For example, as shown in FIG. 11, when the walls 55 and 56 of the socket 50 are formed separately, the socket insertion portion 741*b* and the socket insertion portion 741*c* may be formed separately corresponding to the walls 55 and 56.

In one or more embodiments, the DUT insertion portion 741*a* and the socket insertion portions 741*b* and 741*c* are integrally formed to form one opening 741, but the configurations of the DUT insertion portion 741*a* and the socket insertion portions 741*b* and 741*c* are not particularly limited thereto. For example, the DUT insertion portion 741*a*, the socket insertion portion 741*b*, and the socket insertion portion 741*c* may be separated from each other and formed as separate openings.

A plurality of claws 742 is a member that engage the engaging portion 722 of the body 720 and mounts the core 730 to the body 720. A plurality of claws 742, as shown in FIG. 9, extends upward from the core body 740 (Z-axis direction in the drawing), and is integrally formed with the core body 740.

The bottom of the core body 740, a plurality of holding pieces 743 are provided. A plurality of holding pieces 743 protrudes toward the center of the opening 741 from the bottom of the frame shape of the core body 740. The plurality of holding pieces 743 are integrally formed with the core body 740. These holding pieces 734 abuts the outer peripheral portion of the DUT 90 inserted into the opening 741 from above the core 730. This allows the core body 740 to hold the DUT 90.

Further, the bottom of the core body 740, a plurality of guide holes 744 are formed. The guide hole 744 is provided corresponding to the guide pin 54 of the socket 50. During the test of the DUT 90, as the DUT 90 is pressed against the socket 50, the guide pin 54 is inserted into the guide hole 744. This performs the alignment of the socket 50 and the insert 710. The guide hole 744 in one or more embodiments corresponds to an example of the "guide hole" in the present invention.

The pressing mechanism 750 includes a lever 751 and a spring 752. The pressing mechanism 750, as described later, a mechanism that presses the DUT 90 against the wall 55 of the socket 50 during the test of the DUT 90 and thereby allows alignment of the terminals 91 of the DUT 90 and the contactors 53 (described later) of the socket 50.

The lever 751 includes a pressing portion 7511, and a spring receiver 7512, and is rotatably supported on the rotary shaft 7513. The spring 752 is attached to the spring receiver 7512 in an elastically compressed state and biases the lever 751 in a direction in which the lever 751 rotates. The pressing portion 7511 has a planar shape in contact with the side surface of the DUT 90. The pressing portion 7511 of the lever 751 is in contact with the DUT 90 and thereby the DUT 90 is pressed against the side (Y-axis direction in the drawing).

The pressing mechanism 760, except that it is arranged so as to press the DUT 90 in the X-axis direction in the drawing and has the same configuration as the pressing mechanism 750. In one or more embodiments, the pressing mechanism 750 is arranged to press the DUT 90 in the Y-axis direction and the pressing mechanism 760 is arranged to press the DUT 90 in the X-axis direction. But the arrangement of the pressing mechanism 750,760 is not particularly limited thereto. The pressing mechanisms 750,760 may be arranged any other way that presses the DUT 90 in different directions from each other, in plane view.

Figure 10:
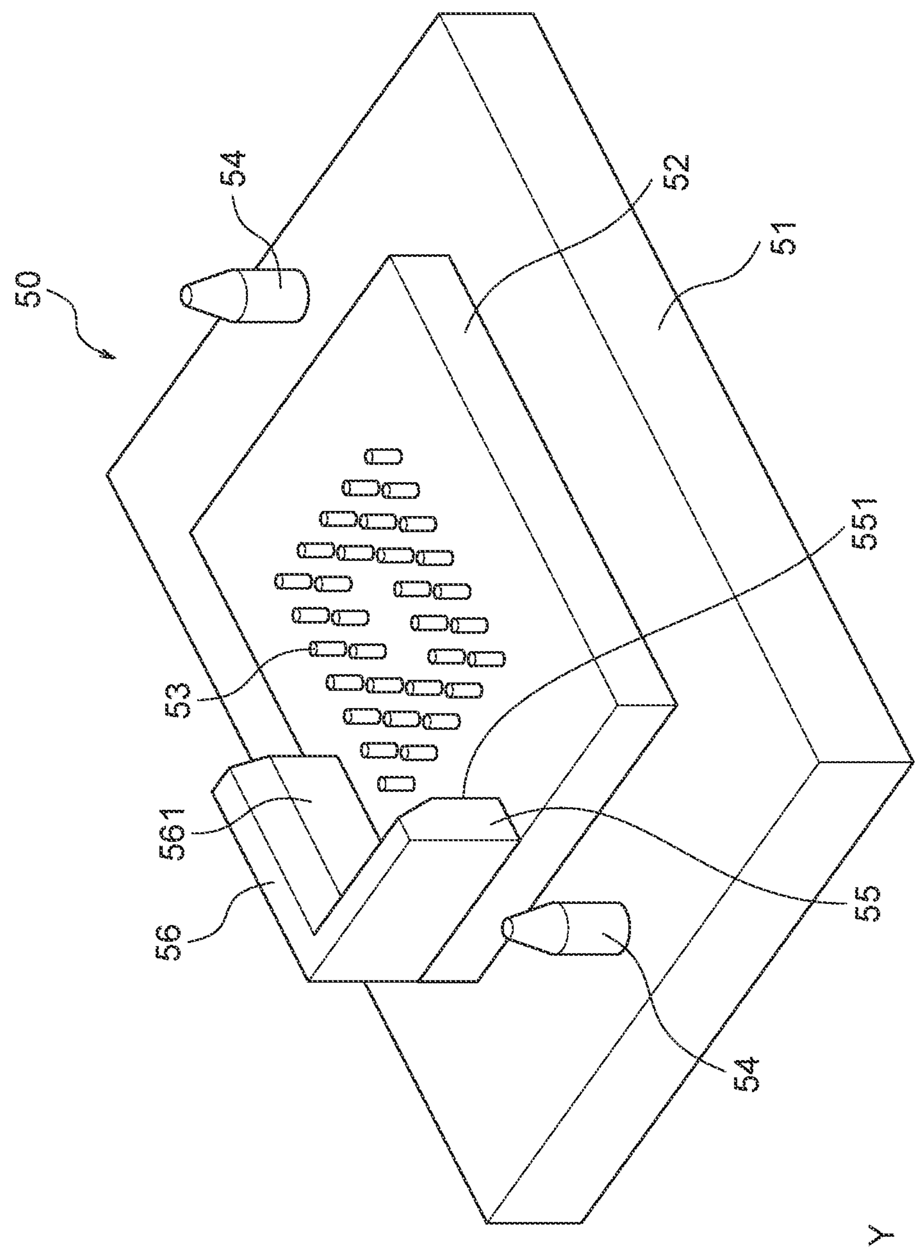
FIG. 10 is a perspective view of a socket in one or more embodiments of the present invention.

FIG. 10 is a perspective view of a socket in one or more embodiments and FIG. 11 is a perspective view of a modification of the socket in one or more embodiments.

The socket 50 includes a base 51, a holder 52, a plurality of contactors 53, a plurality of guide pins 54, and walls 55 and 56. The holder 52 in one or more embodiments corresponds to an example of the "holder" in the present invention, the contactors 53 in one or more embodiments corresponds to an example of the "contactor" in the present invention, the guide pin 54 in one or more embodiments corresponds to an example of the "guide pin" in the present invention, the wall 55 in one or more embodiments corresponds to an example of the "first wall" in the present invention, and the wall 56 in one or more embodiments corresponds to an example of the "second wall" in the present invention.

A plurality of contactors 53 are held by the holder 52 and provided corresponding to a plurality of terminals 91 of the DUT 90. In one or more embodiments, pogo pins are used as the contactors 53, but other than a pogo pin may be used as the contactor 53. For example, a cantilever type probe needle, an anisotropic conductive rubber sheet, or a membrane type in which bumps are formed on an insulating film may be used. The plurality of contactors 53 are arranged in a rectangular ring shape in a plurality of rows on the holder 52. The arrangement of the contactors 53 is not particularly limited thereto and can be appropriately changed according to the arrangement of the terminals 91 of the DUT 90.

The guide pin 54 is provided on the upper surface of the base 51 and protrudes along the pressing direction of the DUT 90 in the test (Z-axis direction in the drawing). The shape of the upper end of the guide pin is narrowed toward the upper. During the test of the DUT 90, the guide pin 54 is inserted into the guide hole 744 of the core 730 along with the pressing of the DUT 90 to the socket 50. This performs alignment of the insert 710 and the socket 50. In one or more embodiments, the socket 50 includes 2 guide pins 54, but the number of guide pins 54 is not particularly limited thereto and may be 1 or 3 or more.

In the electronic component testing apparatus 900 in one or more embodiments, the guide hole 744 is formed in the core body 740 of the insert 710, the socket 50 is provided with a guide pin 54 but is not particularly limited thereto. For example, the core body 740 of the insert 710 may include a guide pin, and a guide hole into which the guide pin is inserted may be formed in the socket 50.

The walls 55 protrude from the holder 52 along the pressing direction (Z-axis direction in the drawing) of the DUT 90 by the handlers in the DUT 90 test. The wall 55 is arranged so that the position of the terminal 91 of the DUT 90 meets the position of the contactors 53 of the socket 50 while the DUT 90 is in contact with the wall 55. The wall 55, in plane view, is disposed outside the holder 52 than the plurality of contactors 53 and extends along the X-axis direction in the drawing. The wall 55 is disposed so that the side surface 551 facing the plurality of contactors 53 is inside (closer to the contactor 53) than the inner wall surface 745 of the core 730 of the insert 710, in plane view.

The wall 56, similarly to the wall 55, protrudes from the holder 52 along the pressing direction of the DUT 90 (Z-axis direction in the drawing). The wall 56 is disposed outside the holder 52 than the contactor 53 in a plane view and extends along the Y-axis direction in the drawing. The wall 56 is disposed so that the side surface 561 facing the contactor 53 is inside the inner wall surface 746 of the core 730 of the insert 710, in plane view.

Though the wall 56 is disposed along the Y-axis direction in the drawing, the arrangement of the wall 56 is not particularly limited thereto, it may be disposed any other way that the wall 56 extends in a direction different from the wall 55 in a plane view. In one or more embodiments, the wall 55 and the wall 56 are integrally formed to constitute one L-shaped wall, but the structure of the wall 55 and the wall 56 is not particularly limited thereto. For example, as shown in FIG. 11, the wall 55 and the wall 56 may be formed separately.

The wall 55 has a tapered shape at the side surface 551 facing the plurality of contactors 53, which is inclined so that the width of the wall 55 along the pressing direction of the DUT90 from the tip of the wall 55 is thicker. The wall 56, similarly to the wall 55, has a tapered shape at the side surface facing the plurality of contactors 53, which is inclined so that the width of the wall 56 along the pressing direction of the DUT 90 from the distal end of the wall 56 is thicker.

The wall 55 enters the interior of the insert 710 through the socket insertion portion 741*b* of the opening 741 of the insert 710 when the handler 1 presses the DUT 90 against the socket 50 to test the DUT90. The pressing mechanism 750 subsequently presses the DUT 90 against the wall 55. This performs alignment in the Y-axis direction of the terminal 91 of the DUT 90 and the contactors 53 of the socket 50. The walls 56 likewise penetrate the interior of the insert 710 via the socket insertion portion 741*c* of the opening 741 of the insert 710 during the DUT 90 test. The pressing mechanism 760 presses the DUT 90 against the wall 56. This performs alignment in the X-axis direction of the terminals 91 of the DUT 90 and contactors 53 of the socket 50.

Figure 12:
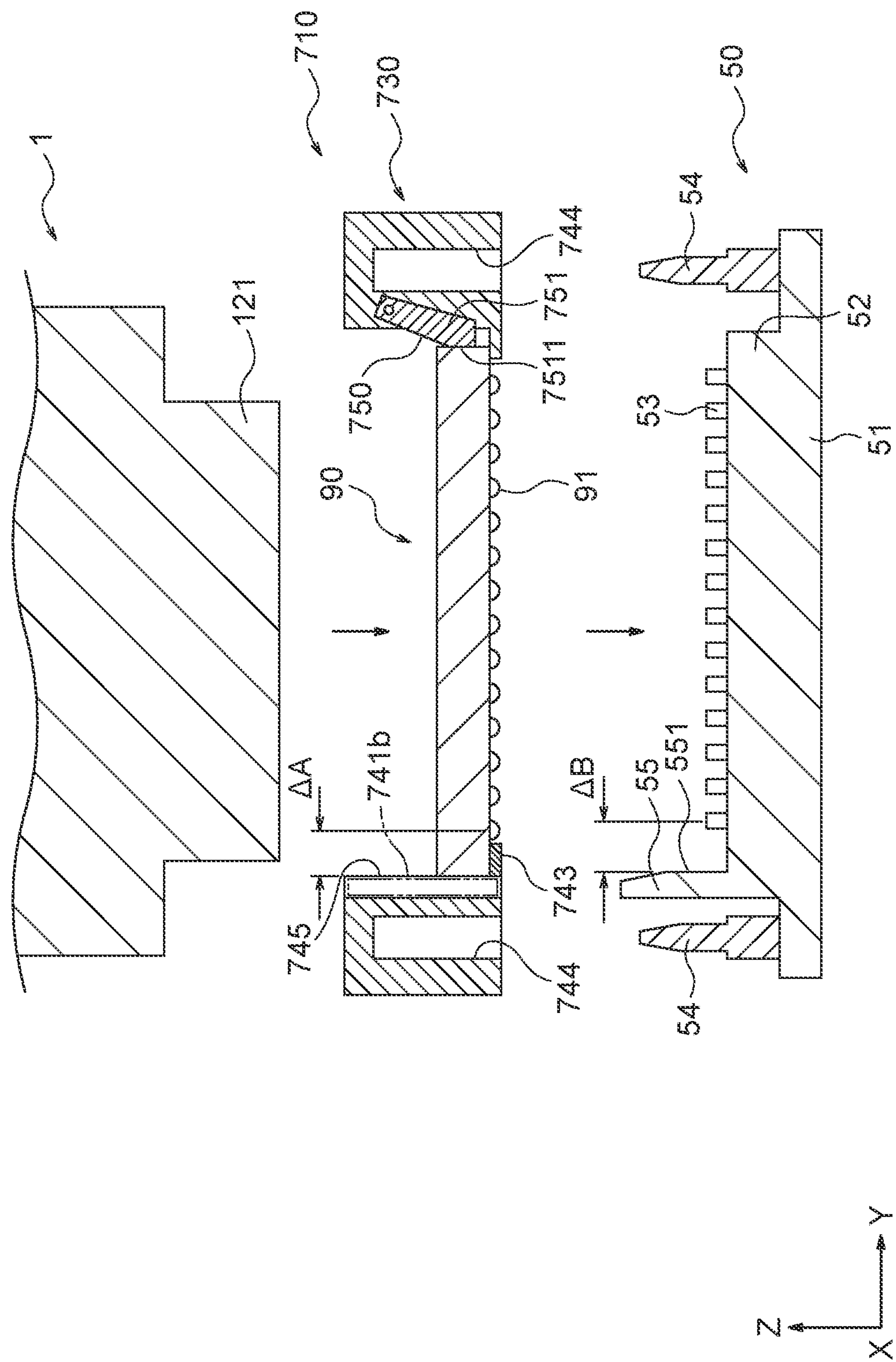
FIG. 12 is a cross-sectional view of a state of testing the DUT by the electronic component testing apparatus according to one or more embodiments of the present invention (Part 1).
Figure 13:
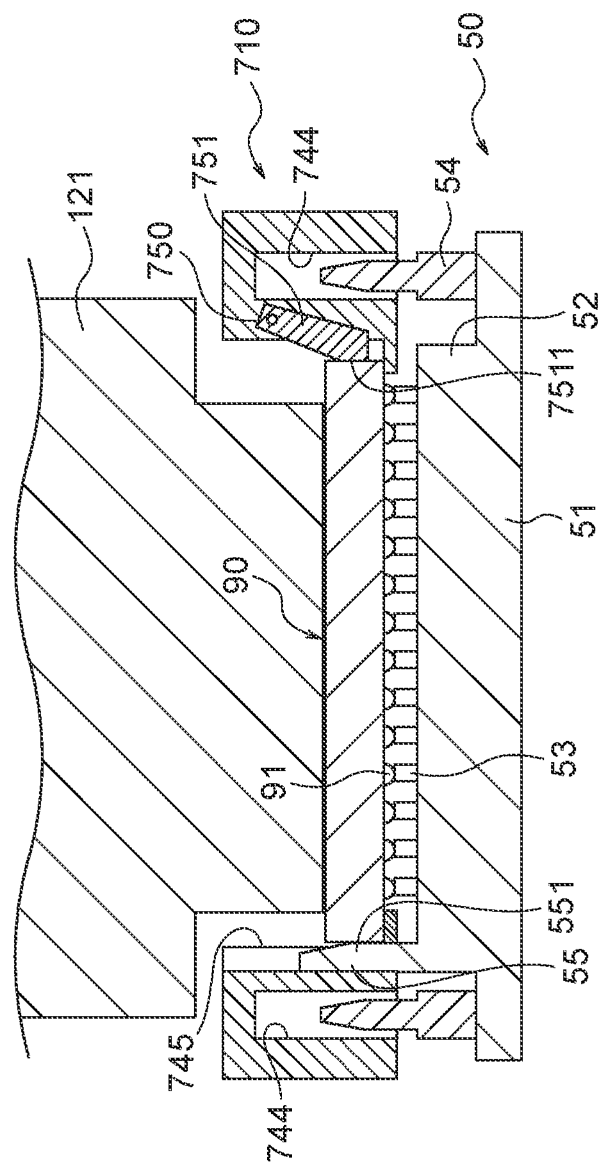
FIG. 13 is a cross-sectional view of a state of testing the DUT by the electronic component testing apparatus according to one or more embodiments of the present invention (Part 2).
Figure 14:
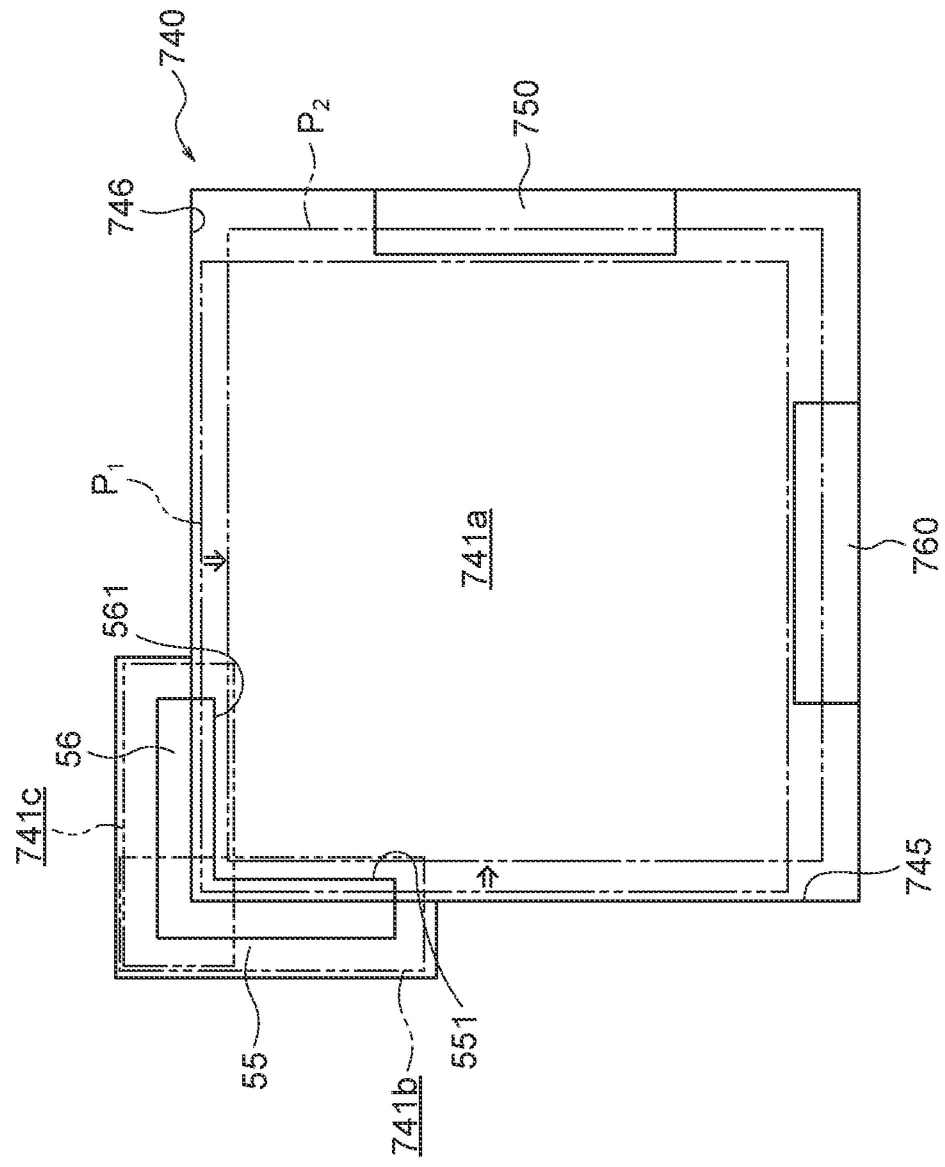
FIG. 14 is a plane view of a state of testing the DUT by the electronic component testing apparatus according to one or more embodiments of the present invention.

The test of the DUT 90 in one or more embodiments is performed using the electronic component testing apparatus 900 described above. FIGS. 12 and 13 is a cross-sectional view of a state of testing the DUT by the electronic component testing apparatus in one or more embodiments, FIG. 14 is a plane view of a state of testing the DUT by the electronic component testing apparatus in one or more embodiments.

First, the DUT 90 is transported to the test tray TST by the device transport apparatus 310 and inserted into the insert 710. Specifically, as shown in FIG. 12, the DUT 90 is inserted into the core 730 through the DUT inserting portion 741*a* of the opening 741 and is held by the holding piece 734. At this time, the DUT 90 is pressed against the inner wall surfaces 745 and 746 of the core body 740 by the pressing mechanisms 750 and 760, as shown in P1 of FIG. 14. The test tray TST holding a plurality of such inserts 710 is transported onto the test head 5, and the test tray TST is lowered by a Z-axis drive (not shown) provided in the test chamber 120 of the handler 1. The handler 1 presses the DUT 90 against the socket 50 by a pusher 121 attached to the Z-axis drive.

As shown in FIG. 13, the DUT 90 is pressed against the socket 50 and thereby the guide pin 54 of the socket 50 is inserted into the guide hole 744 of the core 730. This aligns the insert 710 and the socket 50 with each other.

Further, the DUT 90 is pressed against the socket 50 and thereby the wall 55 of the socket 50 enters the interior of the insert 710 through the socket insertion portion 741*b* of the opening 741 of the core 730. The wall 55 enters between the inner wall surface 745 and the DUT 90 of the core 730. This causes the DUT 90 to move to contact the side surface 551 of the wall 55 along the tapered shape of the wall 55. That is, as shown in FIG. 14, the DUT 90 moves from the position $P_1$ where the DUT 90 is pressed against the inner wall surface 745 of the core 730 by the pressing mechanism 750 towards the positional $P_2$ where the DUT 90 is pressed against the wall 55 of the socket 50. This performs alignment in the Y-axis direction of the terminals 91 of the DUT 90 and the contactors 53 of the socket 50.

Similarly, the wall 56 enters the interior of the insert 710 through the socket insertion portion 741*c* of the opening 741 when the DUT 90 is pressed against the socket 50 and thereby enters between the inner wall surface 746 and the DUT 90 of the core 730. This causes the DUT 90 to move to contact the side surface 561 along the tapered shape of the wall 56. That is, as shown in FIG. 14, the DUT 90 moves from the position $P_1$ where the DUT 90 is pressed against the inner wall surface 746 of the core 730 by the pressing mechanism 760 towards the position P2 where the DUT 90 is pressed against the wall 56 of the socket 50. This performs alignment in the X-axis direction of the terminals 91 of the DUT 90 and the contactors 53 of the socket 50.

As described above, the alignment of the X-axis direction and Y-axis direction completes the alignment of the terminal 91 of the DUT 90 and the contactors 53 of the socket 50. In this condition, the DUT 90 is tested.

Here, in the conventional electronic component testing apparatus that does not have the wall 55, 56 provided with the socket 50, there are 4 elements that affects the alignment accuracy between the terminals 91 of the DUT 90 and the contactors 53 of the socket 50: (i) the dimensional tolerance between the side surface and the terminal of the DUT, (ii) the dimensional tolerance between the center of the guide hole and the inner wall surface of the core, (iii) the fitting tolerance of the guide pin and the guide hole, and (iv) the dimensional tolerance between the center and the contact of the guide pin.

In contrast, in the electronic component testing apparatus 900 according to one or more embodiments, as described above, has the wall 55 provided with the socket 50. Such an apparatus can perform alignment of the terminals 91 of the DUT 90 and the contactors 53 of the socket 50 by pressing the DUT 90 against the wall 55 with the pressing mechanism 750. That is, in the electronic component testing apparatus 900 in one or more embodiments, there are only two elements that affects the alignment accuracy between the terminals 91 of the DUT 90 and the contactors 53 of the socket 50: a dimensional tolerance ΔA between the side surface of the DUT 90 in contact with the wall 55 (in one or more embodiments, specifically, the side surface of the mold package of the DUT 90) and the terminals 91, and a dimensional tolerance ΔB between the wall 55 and the contactors 53 (refer to FIG. 12). This eliminates the dimensional tolerance between the center of the guide hole 744 and the inner wall surface 745 of the core 730 (corresponding to (ii) above) and the fitting tolerance of the guide pin 54 and the guide hole 744 (corresponding to (iv) above). Therefore, the electronic component testing apparatus 900 in one or more embodiments can align the terminals 91 of the DUT 90 and the contactors 53 of the socket 50 with high accuracy.

Further, in the electronic component testing apparatus 900 in one or more embodiments, the wall 55 has a tapered shape which is inclined so that the width of the wall 55 along the pressing direction of the DUT 90 from the distal end of the wall 55 is thicker. This allows the DUT 90 to move smoothly along the tapered shape when the DUT 90 moves from a position pressed against the inner wall surface 745 of the core 730 to a position pressed against the wall 55. This reduces breakage of the DUT 90 due to contacting with the walls 55.

Furthermore, the electronic component testing apparatus 900 in one or more embodiments, the pressing mechanism 750 presses the DUT 90 against the wall 55 and the pressing mechanism 760 presses the DUT 90 against the wall 56. That is, the DUT 90 is pressed in two different directions in a plane view. This allows to determine the position of the DUT90 in plane view based on the two axes. Therefore, the electronic component testing apparatus 900 can align the terminals 91 of the DUT 90 and the contactors 53 of the socket 50 with higher accuracy.

Figure 15A:
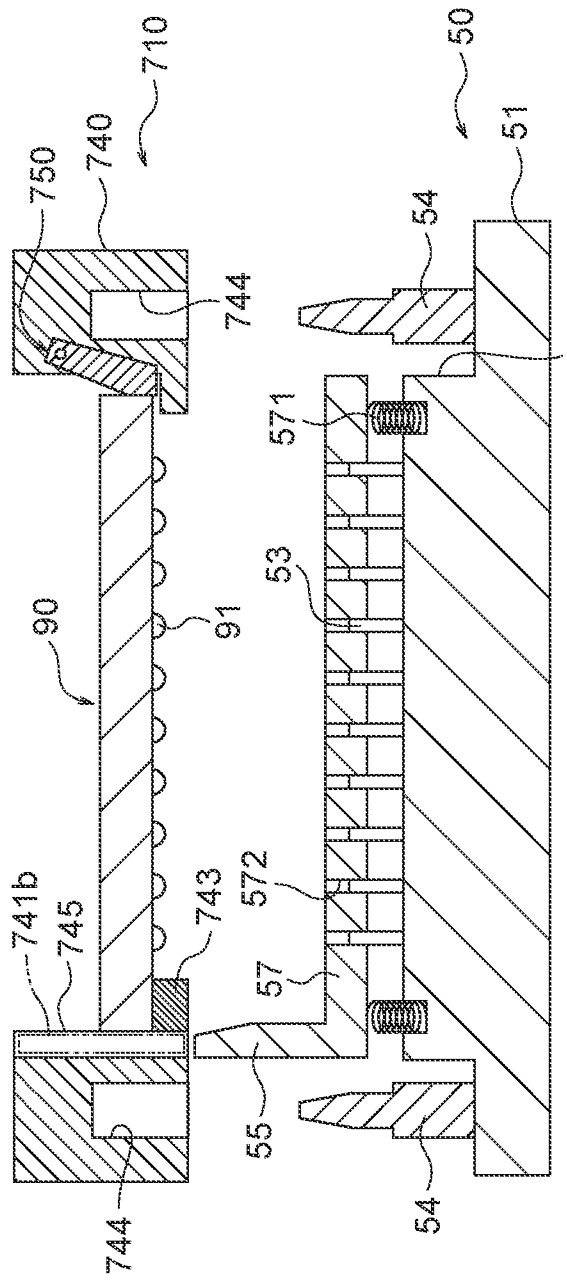
FIG. 15A is a cross-sectional view of a state of testing the DUT using a second modification of the socket in one or more embodiments of the present invention (Part 1).
Figure 15B:
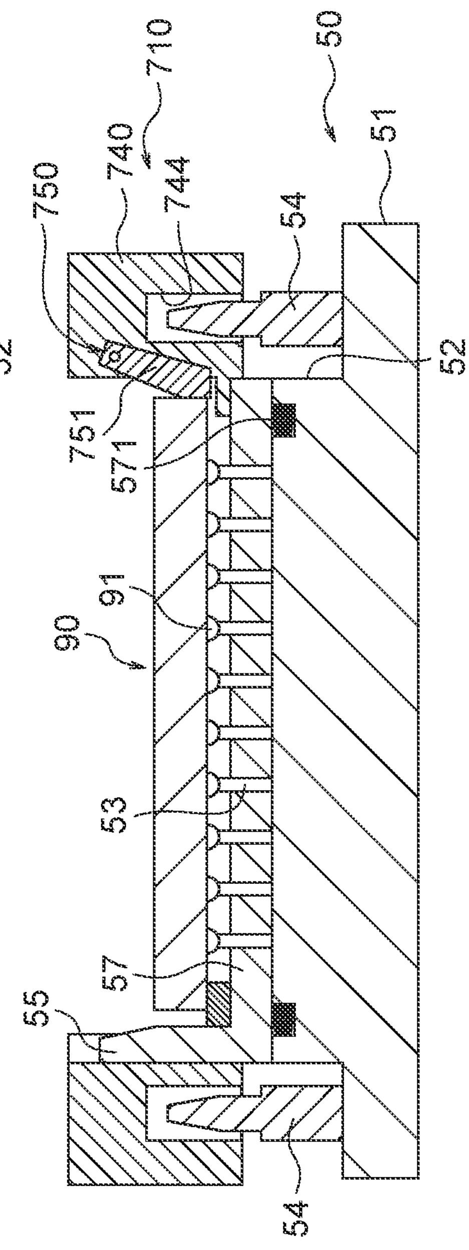
FIG. 15B is a cross-sectional view of a state of testing the DUT using a second modification of the socket in one or more embodiments of the present invention (Part 2).
Figure 16A:
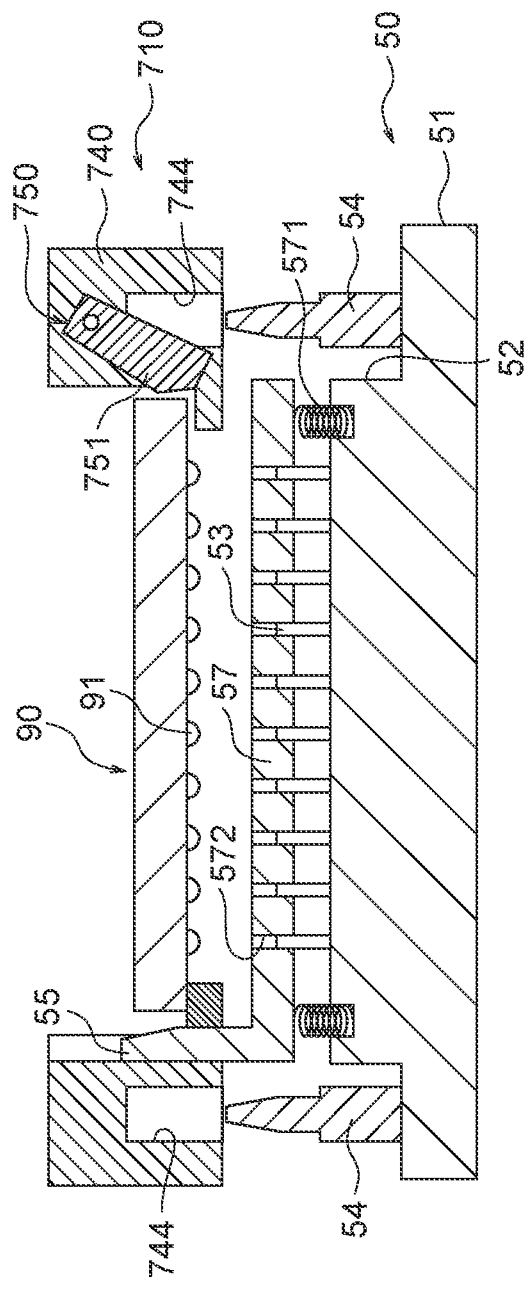
FIG. 16A is a cross-sectional view of a state of testing the DUT using a modification of the insert in one or more embodiments of the present invention (Part 1).
Figure 16B:
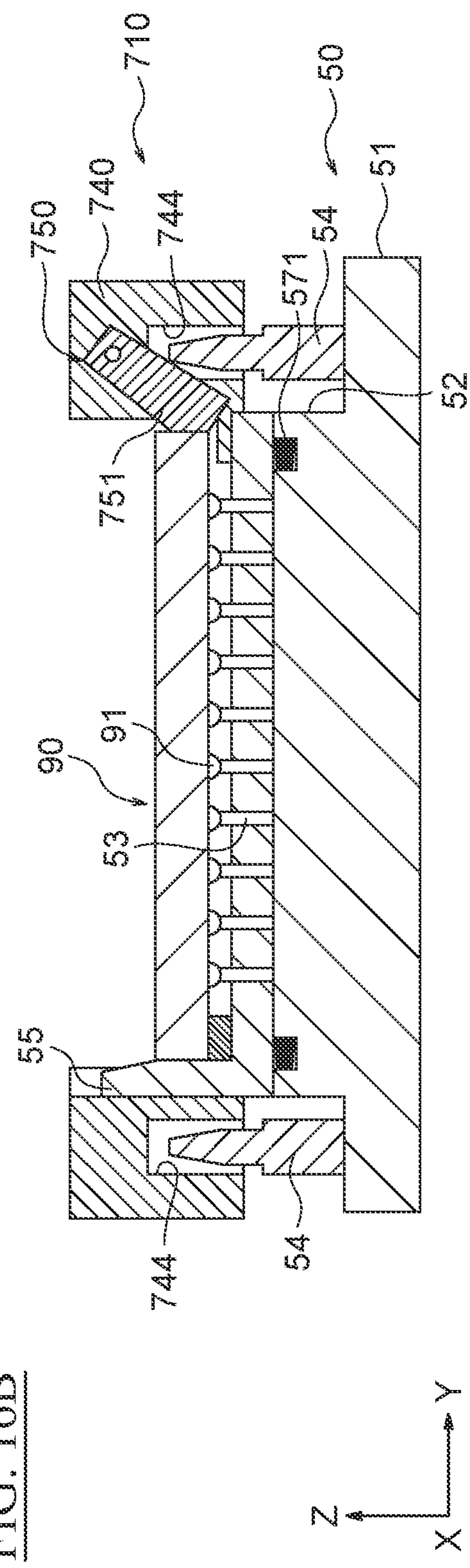
FIG. 16B is a cross-sectional view of a state of testing the DUT using a modification of the insert in one or more embodiments of the present invention (Part 2).

FIG. 15A and FIG. 15B are sectional views of a state of testing the DUT using a second modification of the socket in one or more embodiments, FIG. 16A and FIG. 16B sectional views of a state of testing the DUT using a modification of the insert in one or more embodiments.

As shown in FIGS. 15A and 15B, the socket 50 according to one or more embodiments may further include a top plate 57 provided on the holder 52. The top plate 57 in one or more embodiments corresponds to an example of the "moving member" in the present invention.

The top plate 57 is a plate-like member, is movably supported along the pressing direction of the DUT 90 on the holder 52 by a plurality of springs 571. In one or more embodiments shown in FIGS. 15A and 15B, the walls 55, 56 are arranged on this top plate 57. A plurality of through holes 572 corresponding to the contactors 53 are formed in the top plate 57, and the contactors 53 can contact the DUT 90 terminals 91 through the through holes 572. The walls 55 and 56 to also move along the pressing direction of the DUT 90 because the socket 50 includes the top plate 57. This allows to reduce the impact on the DUT 90 due to the contact of the end of the DUT 90 and the wall 55, 56 when the wall 55, 56 enter the interior of the insert 710, as shown in FIG. 15B. This reduces the damage of the DUT 90 due to contacting with the walls 55 and 56.

In one or more embodiments shown in FIGS. 15A and 15B, the top plate 57 is formed so as to cover the entire holder 52; however, the structure of the moving member is not particularly limited thereto. For example, the moving member may be formed only between the walls 55 and 56 and the holder 52 and may not be formed on the contactors 53.

Further, as shown in FIG. 16A and FIG. 16B, the lever 751 of the pressing mechanism 750 may be provided so as to be exposed inside the guide hole 744. In the form shown in FIG. 16A and FIG. 16B, the pressing mechanism 750 may not include a spring 752. As shown in FIG. 16B, with pressing the DUT 90 to the socket 50, the guide pin 54 is inserted into the guide hole 744, and thereby the guide pin 54 is in contact with the lever 751. This causes the lever 751 to be biased in a direction to rotate and to press DUT90 against the wall 55.

In FIGS. 16A and 16B, the socket 50 includes the top plate 57, but the invention is not particularly limited thereto, and the socket 50 may not include the top plate 57.

Embodiments heretofore explained are described to facilitate understanding of the present invention and are not described to limit the present invention. It is therefore intended that the elements disclosed in the above embodiments include all design changes and equivalents to fall within the technical scope of the present invention.

REFERENCES SIGNS LIST

1 Handler
5 Test head

- 6 Tester
- 7 Cable
- 50 Socket
  - 51 Base
  - 52 Holder
  - 53 Contactor
  - 54 Guide pin
  - 55,56 Wall
  - 57 Top plate
  - 571 Spring
- 100 Test Department
  - 120 Test chamber
  - 121 Pusher
- TST Test tray
  - 700 Frame
    - 701 Outer frame
    - 702 Inner frame
    - 703,704 Opening
    - 705 Fixing member
  - 710 Insert
    - 720 Body
    - 721 Opening
    - 722 Engaging portion
  - 730 Core
    - 740 Core body
      - 741 Opening
      - 741*a* DUT insertion portion
      - 741*b*, 741*c* Socket insertion portion
    - 742 Claw
    - 743 Holding piece
  - 744 Guide hole
    - 745,746 Inner wall surfaces
  - 750,760 Pressing mechanism
    - 751 Lever
      - 7511 Pushing part
      - 7512 Spring receiving part
      - 7513 Axis of rotation
- 90 DUT
  - 91 Terminals
- 900 Electronic component testing apparatus

What is claimed is:

1. An electronic component testing apparatus that tests a DUT (device under test), comprising: a carrier in which the DUT is disposed; a test head comprising a socket; and an electronic component handling apparatus that presses the DUT in the carrier against the socket, wherein the socket comprises: contactors disposed to correspond to terminals of the DUT that are exposed to the socket via a first opening of the carrier; and a first wall projecting toward the carrier along a pressing direction of the DUT, and the carrier comprises a first pressing mechanism that presses the DUT disposed on the socket against the first wall, and the electronic component handling apparatus aligns the terminals with the contactors by pressing the DUT against the socket such that the first pressing mechanism of the carrier presses the DUT against the first wall, the carrier presses the DUT, which is in contact with the first wall, against the first wall to increase contact force between the DUT and the first wall.

2. The electronic component testing apparatus according to claim 1, wherein the first wall enters an interior of the carrier through a second opening of the carrier when the electronic component handling apparatus presses the DUT into the socket.

3. A carrier used in the electronic component testing apparatus according to claim 2 comprising the second opening.

4. The electronic component testing apparatus according to claim 2, wherein the second opening is integrally formed with the first opening.

5. The electronic component testing apparatus according to claim 1, wherein the socket further comprises one of a guide pin and a guide hole that corresponds to the guide pin, the carrier further comprises the other of the guide hole and the guide pin, and the electronic component handling apparatus aligns the carrier with the socket by pressing the DUT to the socket and inserting the guide into the guide hole.

6. The electronic component testing apparatus according to claim 5, wherein the guide pin inserted into the guide hole contacts the first pressing mechanism such that the first pressing mechanism presses the DUT against the first wall.

7. The electronic component testing apparatus according to claim 1, wherein the first wall has a tapered shape inclined such that a width of the first wall becomes larger along the pressing direction from a tip of the first wall.

8. The electronic component testing apparatus according to claim 1, wherein the socket further comprises a second wall that extends in a direction different from a direction in which the first wall extends, a second pressing mechanism presses the DUT disposed on the socket toward the second wall, and the second wall enters an interior of the carrier through a third opening of the carrier when the electronic component handling apparatus presses the DUT against the socket.

9. The electronic component testing apparatus according to claim 1, wherein the socket further comprises:

a holder that holds the contactors; and a moving member movably supported on the holder along the pressing direction, and the first wall is disposed on the moving member.

10. The electronic component testing apparatus according to claim 1, wherein the first pressing mechanism comprises a lever and a spring that biases the lever.

* * * * *